US008962402B1

(12) United States Patent
Sharma et al.

(10) Patent No.: US 8,962,402 B1
(45) Date of Patent: Feb. 24, 2015

(54) LATERAL DIFFUSION METAL OXIDE SEMICONDUCTOR (LDMOS) DEVICE WITH TAPERED DRIFT ELECTRODE

(71) Applicant: International Business Machines Corporation, Armonk, NY (US)

(72) Inventors: Santosh Sharma, Essex Junction, VT (US); Yun Shi, South Burlington, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/966,312

(22) Filed: Aug. 14, 2013

(51) Int. Cl.
*H01L 21/00* (2006.01)
*H01L 29/78* (2006.01)
*H01L 29/06* (2006.01)
*H01L 29/66* (2006.01)

(52) U.S. Cl.
CPC ........ *H01L 29/7825* (2013.01); *H01L 29/0615* (2013.01); *H01L 29/66704* (2013.01)
USPC ........................................... 438/157; 438/197

(58) Field of Classification Search
CPC ................ H01L 29/66681; H01L 29/66825; H01L 29/7816; H01L 29/7801
USPC .................. 257/335, 337, E29.066, E29.256, 257/E29.261; 438/157, 197, 778
See application file for complete search history.

(56) References Cited

U.S. PATENT DOCUMENTS

| 5,204,545 | A | 4/1993 | Terashima |
| 6,368,967 | B1 * | 4/2002 | Besser ........................ 438/687 |
| 6,825,531 | B1 | 11/2004 | Mallikarjunaswamy |
| 6,989,567 | B2 | 1/2006 | Tornblad et al. |
| 7,365,402 | B2 | 4/2008 | Ma |
| 7,525,178 | B2 | 4/2009 | Kulinsky |
| 7,589,378 | B2 | 9/2009 | Kocon et al. |
| 7,683,427 | B2 | 3/2010 | Chen et al. |
| 2004/0251499 | A1 | 12/2004 | Yamaguchi et al. |
| 2010/0102388 | A1 | 4/2010 | Levin et al. |
| 2011/0180882 | A1 * | 7/2011 | Inokuma ...................... 257/390 |
| 2011/0241113 | A1 | 10/2011 | Zuniga |
| 2013/0105887 | A1 | 5/2013 | Zuniga et al. |

FOREIGN PATENT DOCUMENTS

JP      2011129701 A      6/2011

* cited by examiner

*Primary Examiner* — Tucker Wright
(74) *Attorney, Agent, or Firm* — Gibb & Riley, LLC

(57) ABSTRACT

A lateral diffusion metal oxide semiconductor (LDMOS) comprises a semiconductor substrate having an STI structure in a top surface of the substrate, a drift region below the STI structure, and a source region and a drain region on opposite sides of the STI structure. A gate conductor is on the substrate over a gap between the STI structure and the source region, and partially overlaps the drift region. Floating gate pieces are over the STI structure. A conformal dielectric layer is on the top surface and on the gate conductor and floating gate pieces and forms a mesa above the gate conductor and floating gate pieces. A conformal etch-stop layer is embedded within the conformal dielectric layer. A drift electrode is formed on the conformal etch-stop layer over, relative to the top surface, the drift region. The drift electrode has a variable thickness relative to the top surface.

19 Claims, 7 Drawing Sheets

LATERAL DIFFUSION METAL OXIDE SEMICONDUCTOR (LDMOS) DEVICE WITH TAPERED DRIFT ELECTRODE

BACKGROUND

The present disclosure relates to semiconductor structures, and, more particularly, to a lateral diffusion metal-oxide semiconductor (LDMOS) and method of forming the LDMOS structure.

Lateral diffusion metal-oxide-semiconductor (LDMOS) devices are typically used in high voltage applications. An LDMOS field effect transistor (LDMOSFET) is a field effect transistor having a drift region between a gate and a drain region in order to avoid a high electric field at a drain junction, i.e., at the p-n junction between a body and the drain region. An LDMOSFET is typically employed in high voltage power applications involving voltages in the range from about 5 V to about 50 V, which is applied across the drain region and the source region. A substantial fraction of the high voltage may be consumed within the drift region in the LDMOSFET so that the electric field generated across the gate dielectric does not cause breakdown of the gate dielectric.

SUMMARY

According to devices and methods herein, an etch-stop dielectric layer, such as SiN, is embedded in the contact dielectric layer prior to planarization, such as chemical-mechanical polishing (CMP), of the contact dielectric layer such that the planarization occurs above the surface of the etch-stop layer. During formation of the metal wiring layer, etching is stopped on the embedded etch-stop layer, resulting in dramatically reduced height variability. The etch-stop layer may have a taper such that the drift electrode has a tapered bottom surface.

According to one exemplary method herein (other variations of which are apparent from the description below), a substrate of semiconductor material is provided. The substrate has a top surface. Features are formed on the substrate. The features have a height above the top surface of the substrate. Spacing between the features decreases in a direction parallel to the top surface. A first conformal dielectric layer is deposited on the top surface of the substrate and on the features. The first conformal dielectric layer has a tapered profile at a greater height above the top surface of the substrate over the features that are closest together. A conformal etch-stop layer is deposited on the first conformal dielectric layer. A second conformal dielectric layer is deposited on the conformal etch-stop layer. A material removal process is performed on the second conformal dielectric layer. The material removal process stops above, relative to the top surface, the etch-stop layer. An electrode is formed in the second conformal dielectric layer and on the etch-stop layer.

According to another exemplary method herein (other variations of which are apparent from the description below), a substrate of semiconductor material is provided. The substrate has a top surface. Features are formed on the substrate. The features have a height above the top surface of the substrate. A first conformal dielectric layer is deposited on the top surface of the substrate and on the features. A conformal etch-stop layer is deposited on the first conformal dielectric layer. A second conformal dielectric layer is deposited on the conformal etch-stop layer. An additional conformal etch-stop layer is deposited on the second conformal dielectric layer. An additional conformal dielectric layer is deposited on the additional conformal etch-stop layer. A material removal process is performed on the additional conformal dielectric layer. The material removal process stops above, relative to the top surface, the additional etch-stop layer. An electrode is formed in the additional conformal dielectric layer. A first portion of the electrode is formed on the first conformal etch-stop layer, and a second portion of the electrode is formed on the additional conformal etch-stop layer.

According to an exemplary device herein (other variations of which are apparent from the description below), a lateral diffusion metal oxide semiconductor (LDMOS) comprises a semiconductor substrate. The semiconductor substrate comprises a shallow trench isolation (STI) structure in a top surface of the substrate, a drift region below, relative to the top surface, the STI structure, and a source region and drain region on opposite sides of the STI structure. The source region is spaced from the STI structure by a gap. A gate conductor is on the substrate over, relative to the top surface, the gap between the STI structure and the source region. The gate conductor partially overlaps the drift region. Floating gate pieces are on the substrate over, relative to the top surface, the STI structure. A conformal dielectric layer is on the top surface of the substrate and on the gate conductor and the floating gate pieces. The dielectric layer conforms to the gate conductor and floating gate pieces and forms a mesa above, relative to the top surface, the gate conductor. A conformal etch-stop layer is embedded within the conformal dielectric layer. The conformal dielectric layer has a planarized surface above, relative to said top surface, the conformal etch-stop layer. A drift electrode is formed on the conformal etch-stop layer over, relative to the top surface, the drift region. The drift electrode has a variable thickness relative to the top surface.

BRIEF DESCRIPTION OF THE DRAWINGS

The devices and methods herein will be better understood from the following detailed description with reference to the drawings, which are not necessarily drawn to scale and in which.

DETAILED DESCRIPTION

Figure 1:
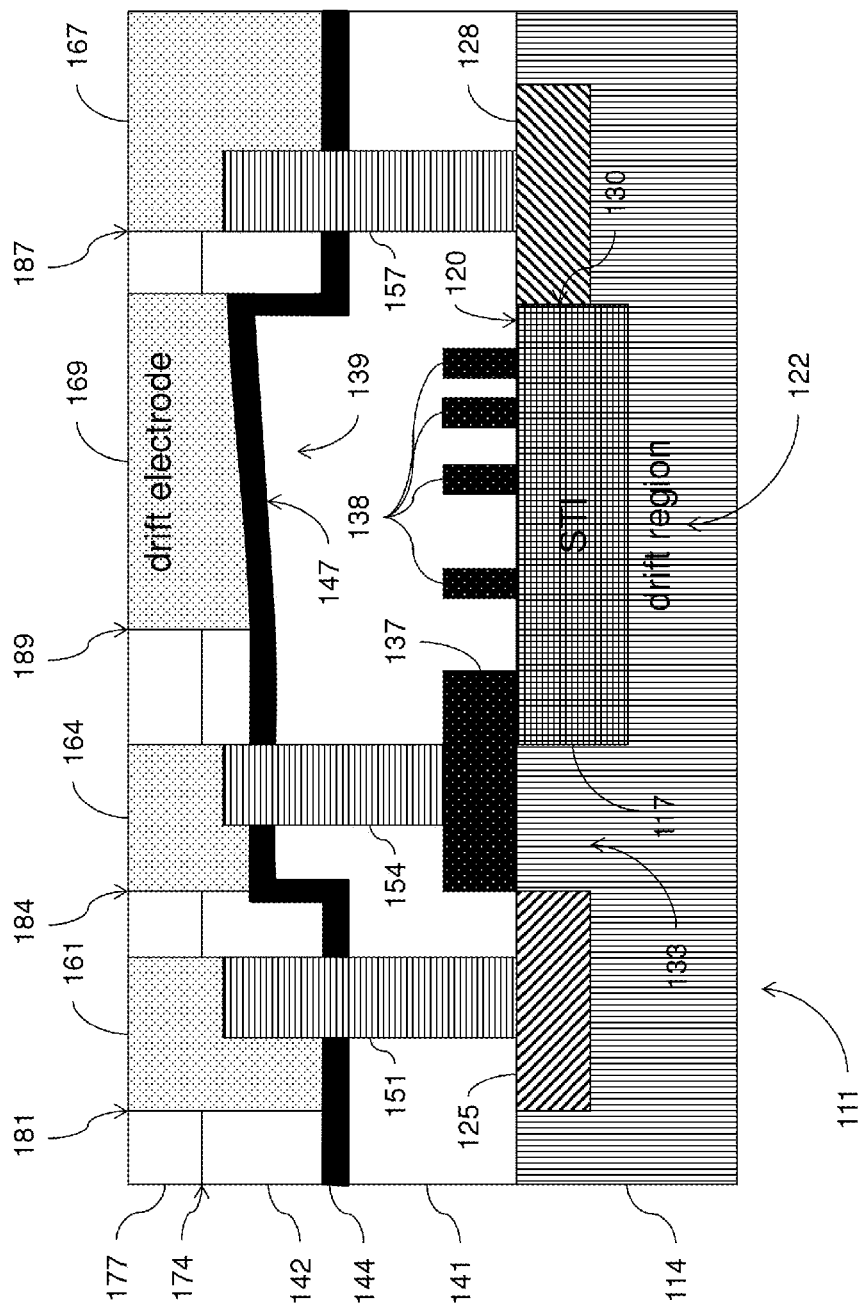
FIG. 1 is a sectional view of semiconductor structure for fabricating a lateral diffusion metal oxide semiconductor (LDMOS) device according to devices and methods herein.

Referring now to the drawings, there is shown exemplary illustrations of the methods and structures of a lateral diffusion metal oxide semiconductor (LDMOS) device formed on a semiconductor substrate.

For purposes herein, a "semiconductor" is a material or structure that may include an implanted impurity that allows the material to sometimes be a conductor and sometimes be an insulator, based on electron and hole carrier concentration.

As used herein, "implantation processes" can take any appropriate form (whether now known or developed in the future) and can comprise, for example, ion implantation, etc.

FIG. 1 illustrates a schematic diagram of a sectional view of a multi-layer device 111 for fabricating an LDMOS transistor.

The multi-layer device 111 includes a silicon substrate 114 having shallow trench isolation (STI) structure 117 formed in a top surface 120 of the silicon substrate 114. The STI structure 117 is made of an insulator that prevents electrical current leakage between adjacent semiconductor device components and may be formed by patterning and etching as is known in the art.

When patterning any material herein, the material to be patterned can be grown or deposited in any known manner and a patterning layer (such as an organic photoresist or hardmask) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

A hardmask can be formed of any suitable material, whether now known or developed in the future, such as a metal or organic or inorganic (Si3N4, SiC, SiO2C (diamond)) hardmask, that has a hardness greater than the substrate and insulator materials used in the remainder of the structure.

A semiconductor drift region 122 is formed in the silicon substrate 114 below the STI structure 117. The silicon substrate 114 also includes a conductive source region 125 and a conductive drain region 128 on opposite sides of the STI structure 117. A side 130 of the conductive drain region 128 may abut the STI structure 117. The conductive source region 125 is spaced apart from the STI structure 117 by a gap 133.

A gate conductor 137 is formed on the top surface 120 of the silicon substrate 114. The gate conductor 137 is formed over the gap 133 between the STI structure 117 and the conductive source region 125. As shown in FIG. 1, the gate conductor 137 is formed above the STI structure 117 and partially overlaps the semiconductor drift region 122. Additionally, the conductive source region 125 may laterally contact the gate conductor 137. Floating gate pieces 138 are formed on the top surface 120 of the silicon substrate 114 above the STI structure 117. According to devices and methods herein, the spacing between the floating gate pieces 138 is gradually reduced the farther the piece is from the gate conductor.

A lower conformal dielectric layer 141 is deposited on the top surface 120 of the silicon substrate 114 and over the gate conductor 137 and the floating gate pieces 138. According to devices and methods herein, the lower conformal dielectric layer 141 may comprise a dielectric or insulator, such as a low-k dielectric such as SiCOH or SiOF, an undoped SiO2 glass or a SiO2-based glass containing phosphorus (PSG), or a SiO2-based glass containing both boron and phosphorus (borophosphosilicate glass, BPSG). The lower conformal dielectric layer 141 conforms to the shape of the gate conductor 137 and floating gate pieces 138, forming a mesa 139 above, and vertically aligned with, the gate conductor 137 and floating gate pieces 138.

For purposes herein a mesa is a structure that protrudes from a plane and has at least one surface that is at a height above the plane. For example, a mesa can be thought of as a trapezoidal structure (having at least one upper flat surface) positioned on a planar surface.

Figure 2:
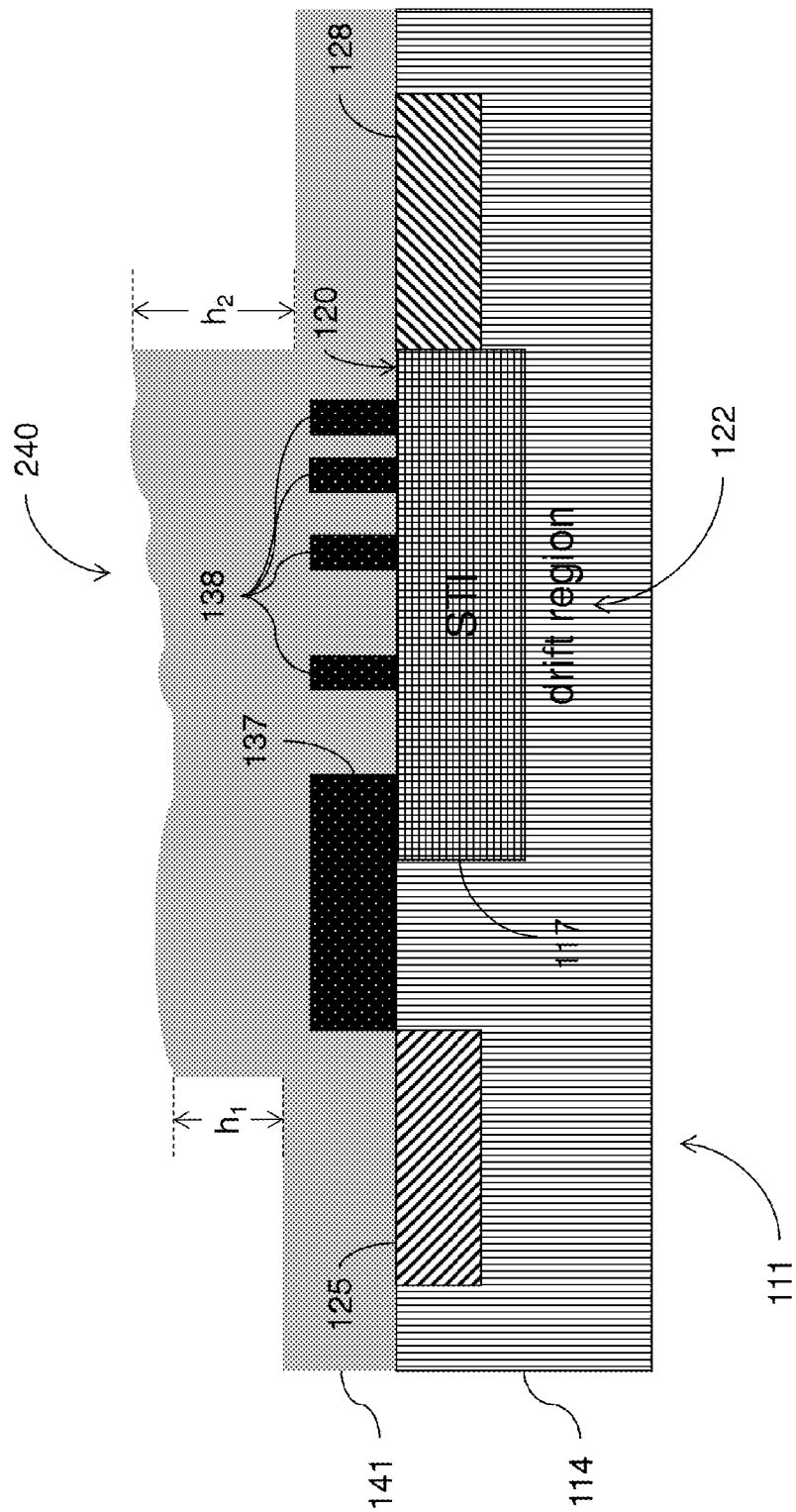
FIG. 2 is a sectional view of the semiconductor structure of FIG. 1 during an intermediate processing step according to devices and methods herein.

Note that the mesa 139 above the gate conductor 137 and the floating gate pieces 138 is shown as planar in FIG. 1 but, would actually have a slight amount of topography 240, as shown in FIG. 2, which shows a cross-section of the multi-layer device 111 immediately after deposition of the lower conformal dielectric layer 141. The topography 240 is due to the dielectric deposition profile using CVD, or another method known in the art. Also note that the thickness of the lower conformal dielectric layer 141 increases over the floating gate pieces 138 as the floating gate pieces 138 are positioned closer together. That is, the thickness of the lower conformal dielectric layer 141 may be '$h_1$' over the gate conductor 137 and the thickness may be '$h_2$' over the most remote one of the floating gate piece 138, such that '$h_2$' is greater than '$h_1$'.

Depositing the lower conformal dielectric layer 141 may be done by any appropriate process known in the art, such as chemical vapor deposition, which can be used to deposit materials in various forms, including monocrystalline, polycrystalline, amorphous, and epitaxial. These materials include silicon, carbon fiber, carbon nanofibers, filaments, carbon nanotubes, SiO2, silicon-germanium, tungsten, silicon carbide, silicon nitride, silicon oxynitride, titanium nitride, and various high-k dielectrics.

For purposes herein, an "insulator" is a relative term that means a material or structure that allows substantially less (<95%) electrical current to flow than does a "conductor." The dielectrics (insulators) mentioned herein can, for example, be formed by plasma deposition of SiO2 or SiO2 based materials by reacting either tetra-ethyl-ortho-silane (TEOS) or silane with O2 or activated O2, i.e. O3 or O—. Alternatively, the dielectrics herein may be formed from any of the many candidate low or high dielectric constant (low-k or high-k) materials, including but not limited to silicon nitride, silicon oxynitride, SiCOH, silicon oxycarbonitride, a gate dielectric stack of SiO2 and Si3N4, and metal oxides like tantalum oxide. The dielectrics can be doped with boron or phosphorus to form, for example, BPSG or PSG, as known in the art. The thickness of dielectrics herein may vary contingent upon the required device performance. In one non-limiting example, the spacing of the lower conformal dielectric layer 141 to the STI structure 117 may have thickness variability of 600+/−30 nm.

Above the lower conformal dielectric layer 141 is a conformal etch-stop layer 144, which is followed by an upper conformal dielectric layer 142. According to devices and methods herein, the conformal etch-stop layer 144 may comprise a nitride layer, such as Silicon Nitride (SiN) or Silicon Carbonitride (SiCN). Other appropriate materials may be used. Due to the varying thickness, as described above, the conformal etch-stop layer 144 will be slightly tapered in the area above the drift region, as shown at 147.

Any appropriate process known in the art, such as chemical vapor deposition (CVD), may be used to deposit the upper conformal dielectric layer 142. The upper conformal dielectric layer 142 may comprise the same or similar materials, such as SiO2-based or low-k dielectrics, as the lower conformal dielectric layer 141.

The upper conformal dielectric layer 142 is planarized, using any known method such as chemical-mechanical polishing (CMP) or patterned reactive ion etch (RIE) etchback, leaving a substantially planar top surface shown by the planarization line 174. Note that the conformal etch-stop layer 144 is not exposed to the planarization process and is under the planarization line 174.

As shown in FIG. 1, a source contact stud 151 is connected to the conductive source region 125; a gate contact stud 154 is connected to the gate conductor 137; and a drain contact stud 157 is connected to the conductive drain region 128. Each of the source contact stud 151, gate contact stud 154, and drain contact stud 157 comprises a conductor extending through the lower conformal dielectric layer 141, the conformal etch-stop layer 144, and the upper conformal dielectric layer 142 providing connectivity to corresponding source, gate and drain regions. The source, gate, and drain contact studs 151, 154, and 157, respectively, may be patterned, etched, and metalized using any known method such as damascene; and any known metals, such as pure or doped Ti, Ta, TiN, TaN, Cu, W, or Al. According to devices and methods herein, the contact studs are formed using a damascene tungsten process, as known in the art. After contact stud metallization, first level wiring is formed. This wiring is formed using a damascene process, where dielectric material is deposited, patterned, and etched; metal is deposited; and excess metal is removed using a material removal process, such as CMP, as known in the art.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, nickel, aluminum, or copper, or a metal silicide, any alloys of such metals, and may be deposited using physical vapor deposition, chemical vapor deposition, or any other technique known in the art.

A source electrode 161 contacts the source contact stud 151. A gate electrode 164 contacts the gate contact stud 154. A drain electrode 167 contacts the drain contact stud 157. A drift electrode 169 is provided over the semiconductor drift region 122. The source, gate, and drain electrodes 161, 164, 167 may contact the top and at least one side of the source, gate, and drain contact studs 151, 154, 157, respectively. According to devices and methods herein, a lateral boundary of the drift electrode 169 remains within the lateral boundaries of the STI structure 117.

As shown in FIG. 1 and described above, in order to form the source, gate, drain, and drift electrodes 161, 164, 167, 169, the upper conformal dielectric layer 142 has been planarized as shown by the planarization line 174. Any appropriate material removal process may be used. Planarization of the upper conformal dielectric layer 142 may be required to ensure a flat surface prior to subsequent lithography and metallization. Without it, the wafer surface topography would extend outside the depth of focus of available lithography, interfering with the ability to pattern; and the formation of metal vias or wires would be impaired due to residual metal left in the recessed topography during either a damascene or subtractive metallization process. Typically, dielectric chemical-mechanical polishing (CMP) is the primary processing method to achieve such planarization between levels. Other removal processes, such as dry dielectric "etch back", may be employed.

As shown in FIG. 1, the planarization line 174 is above the top surface of the conformal etch-stop layer 144. According to devices and methods herein, the conformal etch-stop layer 144 is embedded between the lower conformal dielectric layer 141 and the upper conformal dielectric layer 142 such that the planarization process does not touch the surface of the conformal etch-stop layer 144. Following planarization, an additional dielectric layer 177 may be included prior to metallization, if necessary, as known in the art.

Trenches 181, 184, 187, 189 are patterned into the upper conformal dielectric layer 142 for the source, gate, drain, and drift electrodes 161, 164, 167, 169, respectively. When the trenches that will form the source, gate, drain, and drift electrodes 161, 164, 167, and 169 are etched, the RIE must be selective such that it stops on the conformal etch-stop layer 144. Any RIE process, such as wet etch or reactive ion etch (RIE) may be employed. According to devices and methods herein, a perfluorocarbon—carbon monoxide—hydrofluorocarbon RIE process that etches BPSG with high etch rate but is selective to SiN may be used.

As a result of the tapered shape of the conformal etch-stop layer 144 above the semiconductor drift region 122, the trench 189 for the drift electrode will have a slightly angled bottom, resulting in a tapered drift electrode 169.

As described above, selective RIE may be used to form the trenches 181, 184, 187, 189, stopping at the conformal etch-stop layer 144. It is contemplated that a combination of selective and non-selective RIE can be used to maintain constant thickness of the source, gate, drain, and drift electrodes 161, 164, 167, 169.

Figure 3:
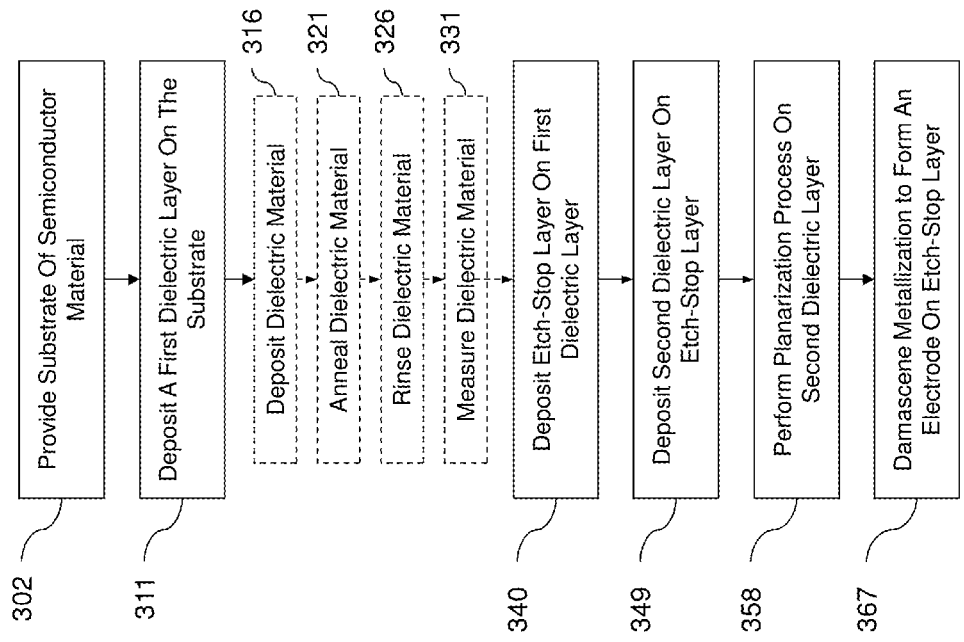
FIG. 3 is a flow diagram according to devices and methods herein.

FIG. 3 shows a logic flowchart for a method of manufacturing a semiconductor device, according to devices and methods herein. At 302, a substrate of semiconductor material is provided. The substrate includes a device having a configuration of features, at least a portion of the features being above the surface of the substrate, such that the topography reveals some raised features. At 311, a first dielectric layer is deposited on the top surface of the substrate. The first dielectric layer conforms to the shape of the topography on the substrate. At least a portion of the first dielectric layer is thicker than remaining portions of the first dielectric layer, giving at least a portion of the first dielectric layer a tapered profile. That is, the first conformal dielectric layer has a tapered profile at a greater height above the top surface of the substrate over the features that are closest together. The first dielectric layer may comprise a high-k dielectric material or other appropriate material, as is known in the art. Optional processing of the first dielectric layer may include: depositing a dielectric material, at 316; annealing the dielectric material, at 321; rinsing the dielectric material, at 326; and measuring the thickness of the dielectric material, at 331. At 340, an etch-stop layer is deposited on the first dielectric layer. At least a portion of the etch-stop layer includes the layered profile. A second dielectric layer is deposited on the etch-stop layer, at 349. Processing of the second dielectric layer may include: depositing a dielectric material, annealing the dielectric material, rinsing the dielectric material, and measuring the thickness of the dielectric material. In this configuration, the etch-stop layer is embedded between the first and second dielectric layers, and conforms to the shape of the lower dielectric layer according to the topography of the semiconductor device, and includes the tapered profile. The etch-stop layer may comprise Silicon Nitride, Silicon Carbonitride, or other appropriate material, as is known in the art. The spacing of the etch-stop layer from the surface of the substrate is controlled by the thickness of the first dielectric layer. At 358, a planarization process, such as chemical-mechanical polishing (CMP) is performed on the second dielectric layer. The etch-stop layer is embedded between the dielectric layers and the planarization process is controlled such that the planarization process stops above the top of the etch-stop layer and does not touch the surface of the etch-stop layer. At 367, damascene metallization is used to form an electrode in the second dielectric layer down on the etch-stop layer. The electrode may have a variable thickness relative to the top surface.

Figure 4:
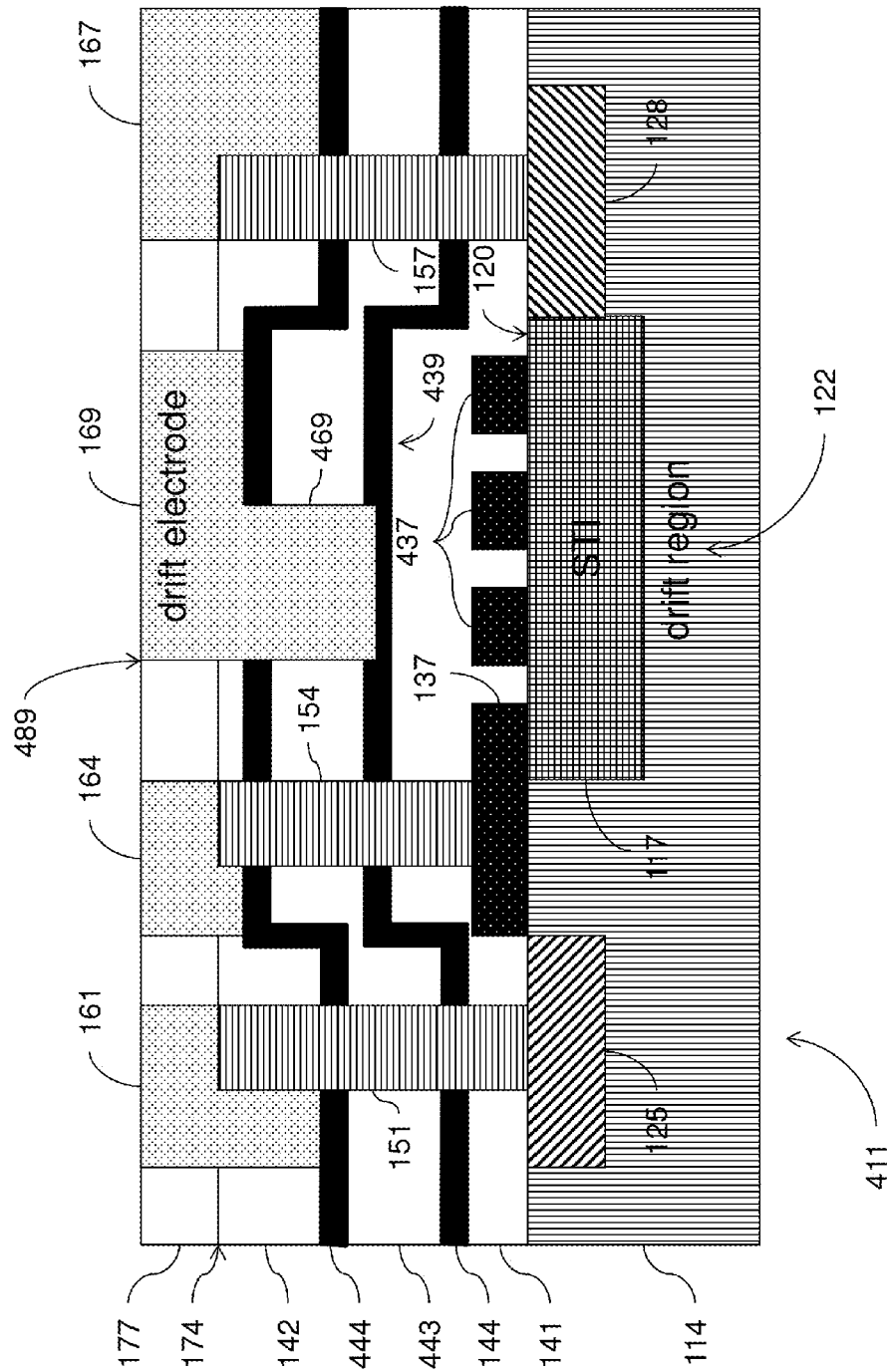
FIG. 4 is a sectional view of semiconductor structure for fabricating another LDMOS device according to devices and methods herein.

FIG. 4 shows a sectional view of an alternative multi-layer device 411 for an LDMOS transistor. The alternative multi-layer device 411, shown in FIG. 4, is similar to the LDMOS multi-layer device 111, shown in FIG. 1, except that the alternative multi-layer device 411 includes more than one embedded etch-stop layer. As shown in FIG. 4, the lower conformal dielectric layer 141 is deposited on the top surface 120 of the silicon substrate 114 and over the gate conductor 137 and the floating gate pieces 437. According to devices and methods herein, the lower conformal dielectric layer 141 may comprise a dielectric or insulator, such as a low-k dielectric such as SiCOH or SiOF, an undoped SiO2 glass or a SiO2-based glass containing phosphorus (PSG), or a SiO2-based glass containing both boron and phosphorus (borophosphosilicate glass, BPSG). The lower conformal dielectric layer 141 conforms to the shape of the gate conductor 137 and the floating gate pieces 437. This forms a wide mesa 439 above the gate conductor 137 and the floating gate pieces 437. In this configuration, the wide mesa 439 may not have a tapered profile, as described with reference to FIG. 1.

Depositing the lower conformal dielectric layer 141 may be done by any appropriate process known in the art, such as chemical vapor deposition (CVD), which can be used to deposit materials in various forms, including monocrystalline, polycrystalline, amorphous, and epitaxial. These materials include silicon, carbon fiber, carbon nanofibers, filaments, carbon nanotubes, SiO2, silicon-germanium, tungsten, silicon carbide, silicon nitride, silicon oxynitride, titanium nitride, and various low-k or high-k dielectrics.

A first conformal etch-stop layer 144 is formed on the lower conformal dielectric layer 141. According to devices and methods herein, the first conformal etch-stop layer 144 may comprise a nitride layer, such as Silicon Nitride (SiN) or Silicon Carbonitride (SiCN). Other appropriate materials may be used.

At least one intermediate conformal dielectric layer 443 may be deposited on the first conformal etch-stop layer 144 by any appropriate process known in the art, such as CVD. The intermediate conformal dielectric layer 443 may comprise the same or similar materials as the lower conformal dielectric layer 141, such as SiO2-based or low-k dielectrics.

Above the intermediate conformal dielectric layer 443 is a second conformal etch-stop layer 444, which is followed by the upper conformal dielectric layer 142. According to devices and methods herein, the second conformal etch-stop layer 444 may comprise a nitride layer, such as Silicon Nitride (SiN) or Silicon Carbonitride (SiCN). Other appropriate materials may be used.

As shown in FIG. 4, the alternative multi-layer device 411 includes a first conformal etch-stop layer 144 and a second conformal etch-stop layer 444, both embedded in the conformal dielectric layers. According to devices and methods herein, the first conformal etch-stop layer 144 and the second conformal etch-stop layer 444 may comprise a nitride layer, such as Silicon Nitride (SiN) or Silicon Carbonitride (SiCN). Other appropriate materials may be used for either conformal etch-stop layer 144, 444.

FIG. 4 shows a configuration having a gate conductor 137 and floating gate pieces 437 having approximately equal spacing between the floating gate pieces 437. Alternatively, the configuration may have a gate conductor 137 and floating gate pieces 138, similar to that shown in FIG. 1, with gradually reduced spacing between the floating gate pieces 138. In either configuration, regardless of the number of embedded etch-stop layers, the planarization line 174 is above the top surface of the top-most etch-stop layer.

Following planarization, an additional dielectric layer 177 may be included prior to metallization, if necessary, as known in the art.

Formation of the source, gate, and drain contact studs 151, 154, 157 and the source, gate, drain, and drift electrodes 161, 164, 167, 169 proceeds as described above. The source, gate, and drain contact studs 151, 154, and 157, respectively, may be patterned, etched, and metalized using any known method such as a damascene process; and any known metals, such as pure or doped Ti, Ta, TiN, TaN, Cu, W, or Al. According to devices and methods herein, the contact studs may be formed using a damascene tungsten process, as known in the art. After contact stud metallization, the source, gate, drain, and drift electrodes 161, 164, 167, 169 are formed. The source, gate, drain, and drift electrodes 161, 164, 167, 169 may be formed using a damascene process, where dielectric material is deposited, patterned, and etched; metal is deposited; and excess metal is removed using a material removal process, such as CMP, as known in the art.

Additionally, according to devices and methods herein, the embedded etch-stop layers provide multiple depths for the source, gate, drain, and drift electrodes 161, 164, 167, 169. For example, as shown in FIG. 4, a combination of selective and non-selective RIE can be used to pattern a trench into the upper conformal dielectric layer 142 and the intermediate conformal dielectric layer 443. In the particular example shown in FIG. 4, a portion of the trench 489 for the drift electrode 169 extends beyond the second conformal etch-stop layer 444 and stops at the first conformal etch-stop layer 144. The drift electrode 169 includes a portion 469 that extends below the second conformal etch-stop layer 544. The combination of selective and non-selective RIE with multiple embedded etch-stop layers can be used to determine the thickness of the source, gate, drain, and drift electrodes 161, 164, 167, 169. While FIG. 4 shows two conformal etch-stop layers 144, 444, it is contemplated that other numbers of conformal etch-stop layers may be used, as necessary, for the particular application. Additionally, FIG. 4 shows a drift electrode 169 having two levels; it is contemplated that other numbers of levels may be used, as necessary, to form a stepped drift electrode 169.

Figure 5:
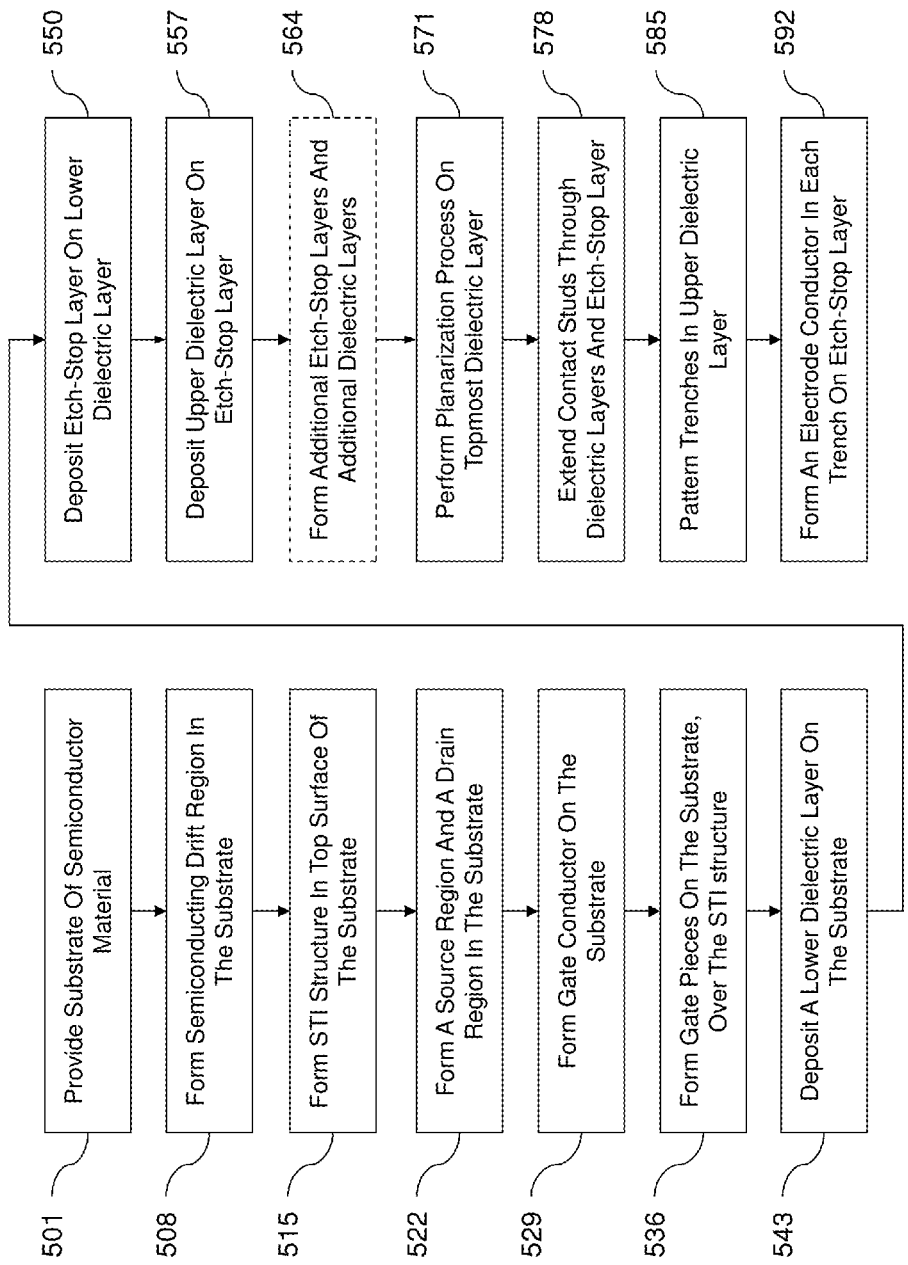
FIG. 5 is a flow diagram according to devices and methods herein.

FIG. 5 shows a logic flowchart for a method of manufacturing an LDMOS structure, according to devices and methods herein. At 501, a substrate of semiconductor material is provided. At 508, a semiconducting drift region is formed in the substrate. A shallow trench isolation (STI) structure is formed in a top surface of the substrate, at 515. The STI structure is formed over the drift region. STI processing is performed as is known in the art. At 522, a source region and a drain region are formed in the substrate on opposite sides of the STI structure. The source region is spaced apart from the STI structure by a gap. At 529, a gate conductor is formed on the substrate over the gap between the STI structure and the source region. The gate conductor partially overlaps the drift region. At 536, floating gate pieces are formed on the substrate, over the STI structure. A lower dielectric layer is deposited on the top surface of the substrate and on the gate conductor and the floating gate pieces, at 543. The lower dielectric layer conforms to the gate conductor and floating gate pieces and forms a mesa above the gate conductor and the floating gate pieces. The lower dielectric layer may comprise borophosphosilicate glass (BPSG) or other appropriate material, as is known in the art. Optional cleaning and rinsing, as described above, may be performed. At 550, an etch-stop layer is deposited on the lower dielectric layer. An upper dielectric layer is deposited on the etch-stop layer, at 557. Processing of the upper dielectric layer may include: depositing a dielectric material, annealing the dielectric material, rinsing the dielectric material, and measuring the thickness of the dielectric material. In this configuration, the etch-stop layer is embedded between the upper and lower dielectric layers, and conforms to the shape of the lower dielectric layer. The etch-stop layer may comprise Silicon Nitride, Silicon Carbonitride, or other appropriate material, as is known in the art. The spacing of the etch-stop layer from the STI structure is controlled by the thickness of the lower dielectric layer. At 564, additional etch-stop layers and additional dielectric layers may optionally be formed, such that several etch-stop layers are embedded between the dielectric layers. At 571, a planarization process, such as chemical-mechanical polishing (CMP) is performed on the topmost dielectric layer. The etch-stop layers are embedded between the dielectric layers and the planarization process is controlled such that the planarization process stops above the top of the topmost etch-stop layer and does not touch the surface of the topmost etch-stop layer. At 578, contact studs are extended through the upper dielectric layer, the etch-stop layers, and all the intermediate dielectric layers. The contact studs comprise a source contact stud connected to the source region, a gate contact stud connected to the gate conductor, and a drain contact stud connected to the drain region. Trenches are patterned in the upper dielectric layer, at 585. The patterning may use reactive ion etching (RIE) and non-selective RIE. In one non-limiting example, the patterning may use selective RIE chemistry to stop on the etch-stop layer. At 589, an electrode conductor is formed in each trench on the etch-stop layer to form a source electrode contacting the source contact stud, a gate electrode contacting the gate contact stud, a drain electrode contacting the drain contact stud, and a drift electrode over the drift region. The drift electrode may have several stepped levels corresponding to the number of etch-stop layers embedded in the structure.

Figure 6:
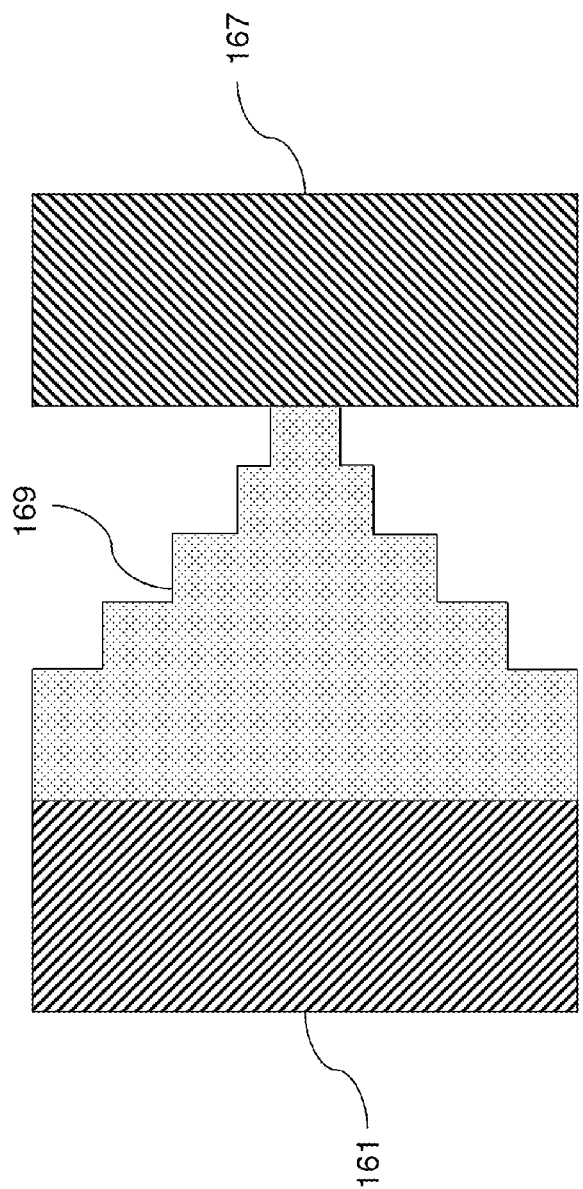
FIG. 6 is a top plan view of semiconductor structure of an LDMOS device according to devices and methods herein.

Referring to FIG. 6, another example of a tapered drift electrode 169 is shown. FIG. 6 shows a top plan view in which the drift electrode is tapered in the horizontal plane, as well as in the vertical plane. Horizontal tapering can be achieved by variation in the masking of the drift electrode 169 for the etching process. A large opening in the drift electrode 169 results in deeper etching, which, in conjunction with the floating gate pieces 138, improves the device breakdown voltage.

In summary, according to devices herein, a lateral diffusion metal oxide semiconductor (LDMOS) comprises a semiconductor substrate. The semiconductor substrate comprises a shallow trench isolation (STI) structure in a top surface of the substrate, a drift region below the STI structure, and a source region and a drain region on opposite sides of the STI structure. The source region is spaced from the STI structure by a gap. A gate conductor is on the substrate over the gap between the STI structure and the source region. The gate conductor partially overlaps the drift region. Floating gate pieces are on the substrate over, relative to the top surface, the STI structure. A conformal dielectric layer is on the top surface of the substrate and on the gate conductor and floating gate pieces. The dielectric layer conforms to the gate conductor and floating gate pieces and forms a mesa above the gate conductor and floating gate pieces. A conformal etch-stop layer is embedded within the conformal dielectric layer. The conformal dielectric layer has a planarized surface above, relative to the top surface, the conformal etch-stop layer. Contact studs extend through the dielectric layer and the etch-stop layer. The contact studs comprise a source contact stud connected to the source region, a gate contact stud connected to the gate conductor, and a drain contact stud connected to the drain region. Electrode conductors comprise a source electrode contacting the source contact stud, a gate electrode contacting the gate contact stud, a drain electrode contacting the drain contact stud. A drift electrode is formed on the conformal etch-stop layer over, relative to the top surface, the drift region. The drift electrode has a variable thickness relative to the top surface.

According to a method of manufacturing an LDMOS structure, a substrate of semiconductor material is provided. A semiconducting drift region is formed in the substrate. A shallow trench isolation (STI) structure is formed in a top surface of the substrate. The STI structure is formed over the drift region. A source region and a drain region are formed in the substrate on opposite sides of the STI structure. The source region is spaced from the STI structure by a gap. A gate conductor is formed on the substrate over the gap between the STI structure and the source region. The gate conductor partially overlaps the drift region. Floating gate pieces are formed on the substrate over the STI region. The spacing between the floating gate pieces decreases in a direction parallel to the top surface. A first conformal dielectric layer is deposited on the top surface of the substrate and on the gate conductor and the floating gate pieces. The first dielectric layer conforms to the gate conductor and floating gate pieces and forms a mesa above the gate conductor and floating gate pieces. The first conformal dielectric layer has a tapered profile at a greater height above the top surface of the substrate over the floating gate pieces that are closest together. A conformal etch-stop layer is deposited on the first conformal dielectric layer. A second conformal dielectric layer is deposited on the conformal etch-stop layer. A chemical-mechanical polishing (CMP) process is performed on the second conformal dielectric layer. The CMP process stops above the etch-stop layer. Contact studs are extended through the dielectric layers and the etch-stop layer. The contact studs comprise a source contact stud connected to the source region, a gate contact stud connected to the gate conductor, and a drain contact stud connected to the drain region. Trenches are patterned in the second conformal dielectric layer using reactive ion etching (RIE). The RIE stops on the etch-stop layer. An electrode conductor is formed on the etch-stop layer to form a source electrode contacting the source contact stud, a gate electrode contacting the gate contact stud, and a drain electrode contacting the drain contact stud. A drift electrode is formed on the second conformal etch-stop layer over, relative to the top surface, the drift region. The drift electrode has a variable thickness relative to the top surface.

Aspects of the present disclosure are described herein with reference to flowchart illustrations and/or block diagrams of methods, apparatus (systems), and computer program products according to various systems and methods. It will be understood that each block of the flowchart illustrations and/or two-dimensional block diagrams, and combinations of blocks in the flowchart illustrations and/or block diagrams, can be implemented by computer program instructions. The computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The flowchart and block diagrams in the figures illustrate the architecture, functionality, and operation of possible implementations of systems, methods, and computer program products according to various devices and methods herein. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

According to a further system and method herein, an article of manufacture is provided that includes a tangible computer readable medium having computer readable instructions embodied therein for performing the steps of the computer implemented methods, including, but not limited to, the method illustrated in FIGS. 4 and 6. Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. Any of these devices may have computer readable instructions for carrying out the steps of the methods described above with reference to FIGS. 4 and 6.

The computer program instructions may be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

Furthermore, the computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

In case of implementing the systems and methods herein by software and/or firmware, a program constituting the software may be installed into a computer with dedicated hardware, from a storage medium or a network, and the computer is capable of performing various functions if with various programs installed therein.

Figure 7:
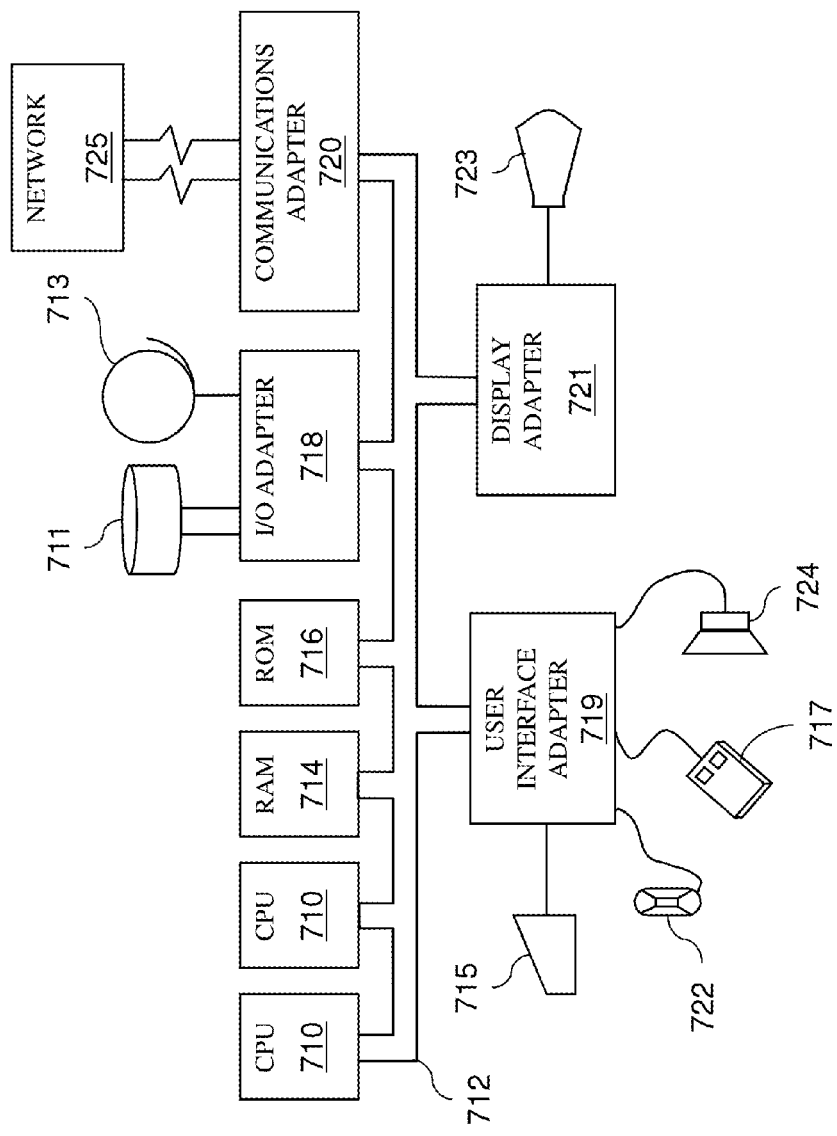
FIG. 7 is a schematic diagram of a hardware system according to devices and methods herein.

A representative hardware environment for practicing the systems and methods herein is depicted in FIG. 7. This schematic drawing illustrates a hardware configuration of an information handling/computer system in accordance with the systems and methods herein. The system comprises at least one processor or central processing unit (CPU) 710. The CPUs 710 are interconnected via system bus 712 to various devices such as a Random Access Memory (RAM) 714, Read Only Memory (ROM) 716, and an Input/Output (I/O) adapter 718. The I/O adapter 718 can connect to peripheral devices, such as disk units 711 and tape drives 713, or other program storage devices that are readable by the system. The system can read the instructions on the program storage devices and follow these instructions to execute the methodology of the systems and methods herein.

In FIG. 7, CPUs 710 perform various processing based on a program stored in a Read Only Memory (ROM) 716 or a program loaded from a peripheral device, such as disk units 711 and tape drives 713 to a Random Access Memory (RAM) 714. In the RAM 714, required data when the CPU 710 performs the various processing or the like is also stored, as necessary. The CPU 710, the ROM 716, and the RAM 714 are connected to one another via a bus 712. An input/output adapter 718 is also connected to the bus 712 to provide an input/output interface, as necessary. A removable medium, such as a magnetic disk, an optical disk, a magneto-optical disk, a semiconductor memory, or the like, is installed on the peripheral device, as necessary, so that a computer program read therefrom may be installed into the RAM 714, as necessary.

The system further includes a user interface adapter 719 that connects a keyboard 715, mouse 717, speaker 724, microphone 722, and/or other user interface devices such as a touch screen device (not shown) to the bus 712 to gather user input. Additionally, a communication adapter 720 including a network interface card such as a LAN card, a modem, or the like connects the bus 712 to a data processing network 725. The communication adapter 720 performs communication processing via a network such as the Internet. A display adapter 721 connects the bus 712 to a display device 723, which may be embodied as an output device such as a monitor (such as a Cathode Ray Tube (CRT), a Liquid Crystal Display (LCD), or the like), printer, or transmitter, for example.

Those skilled in the art would appreciate that the storage medium is not limited to the peripheral device having the program stored therein as illustrated in FIG. 7, which is distributed separately from the device for providing the program to the user. Examples of a removable medium include a magnetic disk (including a floppy disk), an optical disk (including a Compact Disk-Read Only Memory (CD-ROM) and a Digital Versatile Disk (DVD)), a magneto-optical disk (including a Mini-Disk (MD) (registered trademark)), and a semiconductor memory. Alternatively, the storage medium may be the ROM 716, a hard disk contained in the storage section of the disk units 711, or the like, which has the program stored therein and is distributed to the user together with the device that contains them.

As will be appreciated by one skilled in the art, aspects of the systems and methods herein may be embodied as a system, method, or computer program product. Accordingly, aspects of the present disclosure may take the form of an entirely hardware system, an entirely software system (including firmware, resident software, micro-code, etc.) or an system combining software and hardware aspects that may all generally be referred to herein as a "circuit," "module", or "system." Furthermore, aspects of the present disclosure may take the form of a computer program product embodied in one or more computer readable medium(s) having computer readable program code embodied thereon.

Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a Read Only Memory (ROM), an Erasable Programmable Read Only Memory (EPROM or Flash memory), an optical fiber, a magnetic storage device, a portable compact disc Read Only Memory (CD-ROM), an optical storage device, a "plug-and-play" memory device, like a USB flash drive, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including, but not limited to, wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++, or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Deployment types include loading directly in the client, server, and proxy computers via loading a storage medium such as a CD, DVD, etc. The process software may also be automatically or semi-automatically deployed into a computer system by sending the process software to a central server or a group of central servers. The process software is then downloaded into the client computers that will execute the process software. The process software is sent directly to the client system via e-mail. The process software is then either detached to a directory or loaded into a directory by a button on the e-mail that executes a program that detaches the process software into a directory. Alternatively, the process software is sent directly to a directory on the client computer hard drive. When there are proxy servers, the process will select the proxy server code, determine on which computers to place the proxy servers' code, transmit the proxy server code, and then install the proxy server code on the proxy computer. The process software will be transmitted to the proxy server, and then stored on the proxy server.

While it is understood that the process software may be deployed by manually loading directly in the client, server, and proxy computers via loading a storage medium such as a CD, DVD, etc., the process software may also be automatically or semi-automatically deployed into a computer system by sending the process software to a central server or a group of central servers. The process software is then downloaded into the client computers that will execute the process software. Alternatively, the process software is sent directly to the client system via e-mail. The process software is then either detached to a directory or loaded into a directory by a button on the e-mail that executes a program that detaches the process software into a directory. Another alternative is to send the process software directly to a directory on the client computer hard drive. When there are proxy servers, the process will select the proxy server code, determine on which computers to place the proxy servers' code, transmit the proxy server code, and then install the proxy server code on the proxy computer. The process software will be transmitted to the proxy server, and then stored on the proxy server.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For electronic applications, semiconducting substrates, such as silicon wafers, can be used. The substrate enables easy handling of the micro device through the many fabrication steps. Often, many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithography steps, oxidation steps, etching steps, doping steps, and many others are performed. The complexity of microfabrication processes can be described by their mask count.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular devices and methods only and is not intended to be limiting of this disclosure. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various devices and methods herein have been presented for purposes of illustration, but are not intended to be exhaustive or limited to the devices and methods disclosed. Many modifications and variations will be apparent to those of ordinary skill in the art without departing from the scope and spirit of the described devices and methods. The terminology used herein was chosen to best explain the principles of the devices and methods, the practical application or technical improvement over technologies found in the marketplace, or to enable others of ordinary skill in the art to understand the devices and methods disclosed herein with various modifications as are suited to the particular use contemplated.

What is claimed is:

1. A method, comprising:
   providing a substrate of semiconductor material, said substrate having a top surface;
   forming features on said substrate, said features having a first height above said top surface of said substrate, said features comprising features being relatively closer together and features being relatively farther apart, and spacing between said features decreasing in a direction parallel to said top surface;
   depositing a first conformal dielectric layer on said top surface of said substrate and on said features above said top surface, said first conformal dielectric layer having a tapered profile, said first conformal dielectric layer being at a second height above said top surface of said substrate over said features being relatively closer together, said first conformal dielectric layer being at a third height above said top surface of said substrate over said features being relatively farther apart, and said second height being greater than said third height;
   depositing a conformal etch-stop layer on said first conformal dielectric layer;
   depositing a second conformal dielectric layer on said conformal etch-stop layer;
   performing a material removal process on said second conformal dielectric layer, said material removal process stopping above, relative to said top surface, said etch-stop layer; and
   forming an electrode in said second conformal dielectric layer and on said conformal etch-stop layer.

2. The method according to claim 1, said depositing a first conformal dielectric layer on said top surface of said substrate and on said features further comprising forming a mesa in said first conformal dielectric layer above, relative to said top surface, said features, said mesa including said tapered profile; and
   said conformal etch-stop layer and said second conformal dielectric layer having said mesa.

3. The method according to claim 1, further comprising:
   forming a semiconducting drift region in said substrate;
   forming a shallow trench isolation (STI) structure in said top surface of said substrate, said STI structure being formed over, relative to said top surface, said drift region;
   forming a source region and a drain region in said substrate on opposite sides of said STI structure, said source region being spaced from said STI structure by a gap;
   forming a gate conductor on said substrate over, relative to said top surface, said gap between said STI structure and said source region, said gate conductor partially overlapping said drift region; and
   said forming said features on said substrate comprising forming floating gate pieces on said substrate over, relative to said top surface, said STI structure,
   said first conformal dielectric layer conforming to said gate conductor and said floating gate pieces, and forming a mesa above, relative to said top surface, said gate conductor and said floating gate pieces.

4. The method according to claim 3, further comprising:
   extending contact studs through said first conformal dielectric layer, said conformal etch-stop layer, and said second conformal dielectric layer, said contact studs comprising:
       a source contact stud connected to said source region,
       a gate contact stud connected to said gate conductor, and
       a drain contact stud connected to said drain region; and
   patterning an electrode conductor on said etch-stop layer to form:
       a source electrode contacting said source contact stud,
       a gate electrode contacting said gate contact stud,
       a drain electrode contacting said drain contact stud, and
       a drift electrode over, relative to said top surface, said drift region,
           a thickness of each of said source electrode, said gate electrode, and said drain electrode, being determined by a height of a structure below said source electrode, said gate electrode, and said drain electrode, respectively,
           a thickness of said drift electrode being determined by said tapered profile of said first conformal dielectric layer.

5. The method according to claim 4, said patterning an electrode conductor comprising:
   patterning a trench in said second conformal dielectric layer using selective reactive ion etching (RIE) or non-selective RIE, said selective RIE stopping on said etch-stop layer; and
   forming an electrode conductor in said trench.

6. The method according to claim 5, said forming an electrode conductor in said trench comprising using a damascene metallization process.

7. The method according to claim 5, further comprising:
   applying masks to said drift electrode; and
   performing material removal processes on said drift electrode to create a taper in said drift electrode.

8. A method, comprising:
   providing a substrate of semiconductor material, said substrate having a top surface;
   forming features on said substrate, said features having a height above said top surface of said substrate, spacing between said features decreasing in a direction parallel to said top surface;
   depositing a first conformal dielectric layer on said top surface of said substrate and on said features above said top surface, said first conformal dielectric layer having a tapered profile being at a greater height above said top surface of said substrate over said features being closest together than above said top surface of said substrate over said features being spaced farther apart;

depositing a conformal etch-stop layer on said first conformal dielectric layer;

depositing a second conformal dielectric layer on said conformal etch-stop layer;

performing a material removal process on said second conformal dielectric layer, said material removal process stopping above, relative to said top surface, said etch-stop layer; and forming an electrode in said second conformal dielectric layer and on said conformal etch-stop layer, said depositing a first conformal dielectric layer on said top surface of said substrate and on said features further comprising forming a mesa in said first conformal dielectric layer above, relative to said top surface, said features, said mesa including said tapered profile, and said conformal etch-stop layer and said second conformal dielectric layer having said mesa.

9. The method according to claim 8, further comprising:
forming a semiconducting drift region in said substrate;
forming a shallow trench isolation (STI) structure in said top surface of said substrate, said STI structure being formed over, relative to said top surface, said drift region;
forming a source region and a drain region in said substrate on opposite sides of said STI structure, said source region being spaced from said STI structure by a gap; and
forming a gate conductor on said substrate over, relative to said top surface, said gap between said STI structure and said source region, said gate conductor partially overlapping said drift region,
said forming features on said substrate comprising forming floating gate pieces on said substrate over, relative to said top surface, said STI structure,
said first conformal dielectric layer conforming to said gate conductor and said floating gate pieces, and forming a mesa above, relative to said top surface, said gate conductor and said floating gate pieces.

10. The method according to claim 9, further comprising:
extending contact studs through said first conformal dielectric layer, said conformal etch-stop layer, and said second conformal dielectric layer, said contact studs comprising:
a source contact stud connected to said source region,
a gate contact stud connected to said gate conductor, and
a drain contact stud connected to said drain region; and
patterning electrode conductors on said etch-stop layer forming:
a source electrode contacting said source contact stud,
a gate electrode contacting said gate contact stud,
a drain electrode contacting said drain contact stud, and
a drift electrode over, relative to said top surface, said drift region,
a thickness of each of said source electrode, said gate electrode, and said drain electrode, being determined by a height of a structure below said source electrode, said gate electrode, and said drain electrode, respectively, and
a thickness of said drift electrode being determined by said tapered profile of said mesa.

11. The method according to claim 10, said patterning said electrode conductors comprising:

patterning trenches in said second conformal dielectric layer; and forming electrode conductors in said trenches,
said patterning said trenches comprising using selective reactive ion etching (RIE) or non-selective RIE, said selective RIE stopping on said etch-stop layer.

12. The method according to claim 11, said forming electrode conductors in said trenches comprising using a damascene metallization process.

13. The method according to claim 11, further comprising:
applying masks to said drift electrode; and
performing material removal processes on said drift electrode to create a taper in said drift electrode.

14. A method, comprising:
providing a semiconductor substrate having a top surface;
forming floating gate pieces on said semiconductor substrate, said floating gate pieces comprising floating gate pieces being relatively closer together and floating gate pieces being relatively farther apart, and spacing between said floating gate pieces decreasing in a direction parallel to said top surface;
depositing a conformal dielectric layer on said top surface of said semiconductor substrate and on said floating gate pieces, said conformal dielectric layer having a tapered profile, said conformal dielectric layer being at a greater height above said top surface of said semiconductor substrate over said floating gate pieces being relatively closer together than above said top surface of said semiconductor substrate over said floating gate pieces being relatively farther apart, said conformal dielectric layer forming a mesa above, relative to said top surface, said floating gate pieces, said mesa including said tapered profile; and
forming an electrode in said conformal dielectric layer.

15. The method according to claim 14, further comprising:
depositing a conformal etch-stop layer on said conformal dielectric layer; and
depositing an additional conformal dielectric layer on said conformal etch-stop layer,
said conformal etch-stop layer and said additional conformal dielectric layer having said mesa.

16. The method according to claim 14, further comprising:
forming a drift region in said semiconductor substrate;
forming a shallow trench isolation (STI) structure in said top surface of said semiconductor substrate, said STI structure being formed over, relative to said top surface, said drift region;
forming a source region and a drain region in said semiconductor substrate on opposite sides of said STI structure; and
forming a gate conductor on said semiconductor substrate, said gate conductor partially overlapping said drift region,
said conformal dielectric layer conforming to said gate conductor and said floating gate pieces, and
said mesa being above, relative to said top surface, said gate conductor and said floating gate pieces.

17. The method according to claim 16, further comprising:
extending contact studs through said conformal dielectric layer, said contact studs comprising:
a source contact stud connected to said source region,
a gate contact stud connected to said gate conductor, and
a drain contact stud connected to said drain region.

18. The method according to claim 17, further comprising:
patterning electrode conductors forming:
a source electrode contacting said source contact stud,
a gate electrode contacting said gate contact stud, a drain electrode contacting said drain contact stud, and
a drift electrode over, relative to said top surface, said drift region,
    the thickness of each of said source electrode, said gate electrode, and said drain electrode, being determined by a height of a structure below said source electrode, said gate electrode, and said drain electrode, respectively,
    the thickness of said drift electrode being determined by said tapered profile of said conformal dielectric layer.

19. The method according to claim 18, said patterning electrode conductors comprising using a damascene metallization process.

\* \* \* \* \*